United States Patent
Laurent et al.

[19]

[11] Patent Number: 6,160,425
[45] Date of Patent: Dec. 12, 2000

[54] FREQUENCY CONVERTER

[75] Inventors: Desclos Laurent; Mohammad Madihian, both of Tokyo, Japan

[73] Assignee: NEC Corporation, Tokyo, Japan

[21] Appl. No.: 09/304,832

[22] Filed: May 5, 1999

[30] Foreign Application Priority Data

May 8, 1998 [JP] Japan .................................. 10-125577

[51] Int. Cl.[7] .................................................. H03B 19/00
[52] U.S. Cl. ......................... 327/113; 327/408; 455/323; 455/325; 455/319; 455/333
[58] Field of Search ..................................... 327/113, 102, 327/408; 455/323, 325, 333, 118, 318, 319, 320

[56] References Cited

U.S. PATENT DOCUMENTS

| | | | |
|---|---|---|---|
| 4,592,095 | 5/1986 | Ohnishi et al. ......................... | 455/319 |
| 5,428,837 | 6/1995 | Bayruns et al. ......................... | 455/318 |
| 5,448,197 | 9/1995 | Sagawa et al. ......................... | 327/408 |
| 5,606,738 | 2/1997 | Onodera et al. ......................... | 455/333 |

OTHER PUBLICATIONS

Madihian et al.; "A Monolithic AlGaAs/InGaAs Upconverter IC for K–Band Wireless Networks"; IEEE Transactions on Microwave Theory and Techniques; vol. 43, No. 12; Dec. 1995; pp. 2773–2778.

Takimoto et al.; "Research Activities on Millimeter Wave Indoor Communication Systems in Japan"; IEEE MTT–S Digest; 1993; pp. 673–676.

*Primary Examiner*—Kenneth B. Wells
*Assistant Examiner*—Long Nguyen
*Attorney, Agent, or Firm*—Foley & Lardner

[57] ABSTRACT

A frequency converter has both an up-conversion and a down-conversion circuit in a compact circuit design. The converter is operated as an upconverter by activating a first control FET, and is operated as a downconverter by activating a second control FET. The overall converter circuit includes a first inductor connected, through a first matching circuit, to an input port; a first control FET connected through a first capacitor to a first junction point of the first matching circuit and the first inductor, and to a control voltage terminal; a mixing FET connected through a second matching circuit to a local oscillator signal port, and to the first junction point; a second inductor connected, through a third matching circuit, to the mixing FET; a second control FET connected through a second capacitor to a second junction point of the third matching circuit and the second inductor, and to the control voltage terminal through an inverter circuit; and an output port connected through a fourth matching circuit to the second junction point.

9 Claims, 6 Drawing Sheets

FREQUENCY CONVERTER

BACKGROUND OF THE INVENTION

1. Field of the Invention

The present invention relates to a frequency converter in transceivers used in communication systems.

2. Description of the Related Art

In any communication system, a complete transceiver unit having a transmission function and a reception function must have a frequency converter with an up-conversion capability to convert IF (intermediate frequency) signals to RF (radio frequency) signals and a down-conversion capability to convert RF signals to IF signals. The present invention relates to such a frequency converter having an up-conversion capability and a down-conversion capability.

FIG. 5 shows a conventional frequency converter of this type comprised by a separately provided upconverter 29 and a down converter 30 and a common local oscillator (generator) 38 shared by the upconverter 29 and the downconverter 30.

Upconverter 29 has an IF input port 31, which is connected to the input terminal of an input matching circuit 32. The output terminal of the input matching circuit 32 is connected to a mixer circuit 32, which is also connected to a local oscillator 38 and outputs RF signals by receiving IF signals from the matching circuit 32 and mixing with local oscillator signals 37 (having a frequency F0) from the local oscillator 38. The output terminal of the mixer circuit 33 is connected to the input terminal of the output matching circuit 35. Output terminal of the output matching circuit 35 is connected to the RF output port 36.

Downconverter 30 has an RF input port 39, which is connected to the input terminal of an input matching circuit 40. The output terminal of the input matching circuit 40 is connected to a mixer circuit 41, which is also connected to the local oscillator 38 and outputs IF signals by receiving IF signals from the matching circuit 40 and mixing with local oscillator signals 45 (having the same frequency F0 as the local oscillator signals 37) from the local oscillator 38. The output terminal of the mixer circuit 41 is connected to the input terminal of the output matching circuit 43. Output terminal of the output matching circuit 43 is connected to the IF output port 44.

Matching circuits 32, 43 are provided for the purpose of matching the IF output to a fixed frequency F1 in the IF band, and matching circuits 40, 35 are provided for the purpose of matching the RF output to a fixed frequency F2 (>F1) in the RF band.

For more details of the technology, refer to Y. Takimoto et. al. "Research activities on millimeter wave indoor communication systems in Japan, IEEE MTT-S Digest, 06, pp. 673–676, 1993.

FIG. 6 shows another conventional frequency converter used in communication systems. This frequency converter, as in the frequency converter shown in FIG. 5, is comprised by an upconverter 29, a downconverter 30 and a common local oscillator 38 shared by the upconverter 29 and the downconverter 30. Upconverter 29 and downconverter 30 are each provided with respective FETs (field-effect-transistor) 47 and 46 as the mixing elements to comprise the mixing circuit (corresponding to 33, 41 in FIG. 5). The upconverter 29 has a resonance type LC circuit 49 as the element to constitute the matching circuit 32 in FIG. 5 and a strip line 51 as the element to constitute the matching circuit 35 in FIG. 5. The downconverter 30 has a strip line 50 as the element to constitute the matching circuit 40 in FIG. 5, and a resonance type LC circuit 48 as the element to constitute the matching circuit 43 in FIG. 5. In FIG. 6, 52~55 refer to strip lines.

For further details of the device shown in FIG. 6, refer to M. Madihian et. al. "A monolithic AlGaAs/InGaAs upconverter IC for K-band wireless network", IEEE Transactions on Microwave Theory and Techniques, Vol. 43, No.12, pp2773~2778, Dec. 12, 1995, for example.

One of the problems of the devices shown in FIGS. 5 and 6 is that the devices occupy a large space so that the integrated circuit manufacturing cost is increased in proportion to the amount of space required on the IC substrate.

In other words, to obtain a complete transceiver using such a design concept, it is necessary to provide four ports: IF input port 31; IF output port 44; RF input port 39; and RF output port 36. In general, external connection sections for IF and RF input and output pads consume some substrate area, causing an increase in the overall area of the device. Also, the mixing circuits 33, 41 that constitute the respective upconverter 29 and downconverter 30 (or FETs 47, 46 serving as the mixing elements to constitute the mixer circuits 33, 41) also require own matching circuits for the corresponding input/output regions, leading to an overall requirement of four matching circuits.

Another problem in the design of the devices shown in FIGS. 5 and 6 is that it is not possible to appropriately modify a target frequency to achieve matching, within the IC circuitry. The reason is that the matching circuits have respective fixed frequencies so that a target frequency to achieve matching are invariant.

SUMMARY OF THE INVENTION

It is an object of the present invention to provide a frequency converter that resolves the problems mentioned above by providing flexibility in frequency matching in a compact design.

The object has been achieved in a frequency converter comprising: a first matching circuit (2) having one end connected to an input port (1) for receiving input signals; a first inductor (3) having one inductor end connected to other end of the second matching circuit (2), and other inductor end to a first voltage source (VG); a first control element (5 or 23) having a first port connected, through a first capacitor (4), to a first junction (17) of the first inductor (3) and the first matching circuit (2), a grounded second port, and a third port connected to a control voltage terminal (20) to be activated with a control voltage supplied from either the first voltage source (VG) or a second voltage source (VD); a second matching circuit (10) having one end connected to a local oscillator signal port (9) for inputting local oscillator signals ($L_O$); a mixing element (7 or 22), having a first port connected to the first junction (17), a second port connected to other end of the second matching circuit (10), and a third port, wherein signals at said first port and said second port are mixed and output to said third port; a third matching circuit (18) having one end connected to the third port of the mixing element (7 or 22); a second inductor (13) having one inductor end connected to other end of the third matching circuit (18), and other inductor end to the second voltage source (VD); a second control element (11 or 24) having a first port connected, through a second capacitor (12), to a second junction point (19) of the second inductor (13) and the third matching circuit (18), a grounded second port; and a third port connected, through an inverter circuit (21), to the control voltage terminal (20); and a fourth matching circuit

(15) having one end connected to the second junction point (19), and other end to an output port (16).

Accordingly, the present frequency converter circuitry occupies only a half the space required by the conventional frequency converters, and therefore, it would be of great interest to circuit integration needs in various communications fields.

A compact design has been made possible because, in practice, most of the high frequency patches are combined within or between the low frequency patches, so that the determining factor for circuit size is governed by the array size for the lowest frequency signals.

Also, the present frequency converter can be manufactured at a lower cost than conventional converters, and the circuit parameters can be adjusted by trimming.

Additionally, conventional converters are normally made on a larger substrate involving more than two layers. In contrast, the present converter is based on one printed base, and the cost is correspondingly lower, and reduction in substrate size means lower cost. Furthermore, because there is only one layer to be trimmed, manufacturing time is reduced appreciably and the overall process complexity is significantly simplified.

DESCRIPTION OF THE PREFERRED EMBODIMENTS

Preferred embodiments will be presented with reference to FIGS. 1~4.

Figure 1:
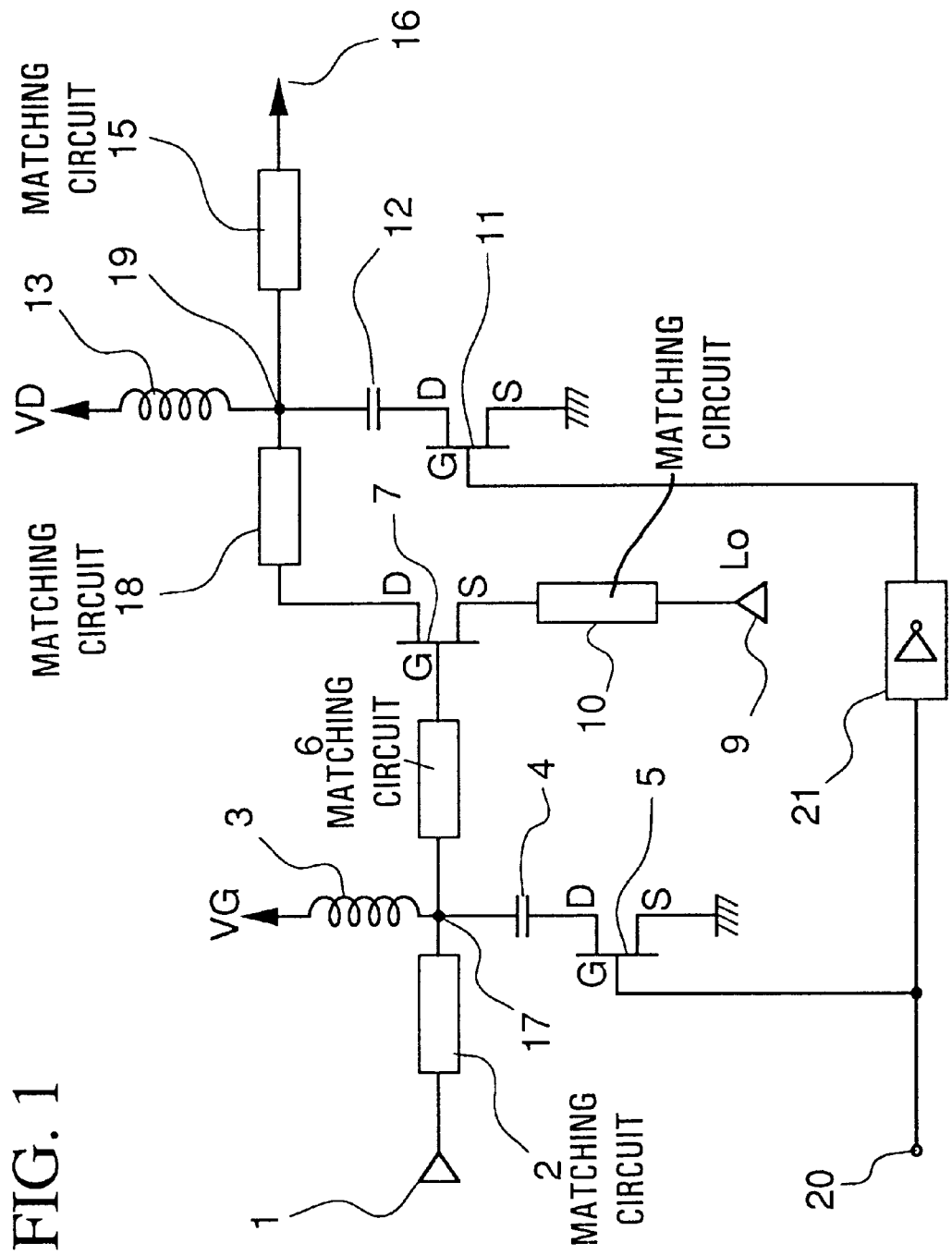
FIG. 1 is a block diagram of a first embodiment of the frequency converter of the present invention.

With reference to FIG. 1, the first embodiment of the frequency converter is comprised by:

a first matching circuit 2, constituted by transmission lines, having one end connected to an input port 1 for receiving input signals;

a first inductor 3 having one inductor end connected to other end of the first matching circuit 2, and other inductor end to a first voltage source VG;

a first control element 5 having a first port connected, through a first capacitor 4, to a first junction point 17 of the first inductor 3 and the first matching circuit 2, a grounded second port; and a third port connected to a control voltage terminal 20 to be activated with a control voltage supplied from either the first voltage source or a second voltage source;

a second matching circuit 10, constituted by transmission lines, having one end connected to a local oscillator signal port 9 for inputting local oscillator signals $L_o$;

a mixing element 7, having a first port connected to the first junction point 17, a second port connected to other end of the second matching circuit 10, and a third port, wherein signals at said first port and said second port are mixed and output to said third port;

a third matching circuit 18, constituted by transmission lines, having one end connected to the third port of the mixing element 7;

a second inductor 13 having one inductor end connected to other end of the third matching circuit 18, and other inductor end to the second voltage source VD;

a second control element 11 having a first port connected, through a second capacitor 12, to a second junction point 19 of the second inductor 13 and the third matching circuit 18, a grounded second port; and a third port connected, through an inverter circuit 21, to the control voltage terminal 20; and a fourth matching circuit 15 having one end connected to the second junction point 19, and other end to an output port 16.

The frequency converter is operated as an upconverter in the following way: the first voltage (0 volt, to be explained later), which turns on the first-second port operation in the first control element 5 and simultaneously turns off the first-second port operation of the second control element 11, is applied to the control voltage terminal 20. On the other hand, the converter is operated as a downconverter in the following way: the second voltage (1 volt, to be explained later), which turns on the first-second port operation of the first control element 5 and simultaneously turns on the first-second port operation of the second control element 11, is applied to the control voltage terminal 20.

Also, the first port of the mixing element 7 is connected, through the fifth matching circuit 6 comprised by transmission lines, to the first junction point 17.

The mixing element 7 shown in FIG. 1 is a mixing FET 7 having a gate, a source and a drain corresponding, respectively, to the first, second and third ports.

The control element 5 shown in FIG. 1 is a first control FET 5 having a drain, a source and a gate corresponding, respectively, to the first, second and third ports, and, the control element 11 shown in FIG. 1 is a control FET 11 having a drain, a source and a gate corresponding, respectively, to the first, second and third ports.

The frequency converter in FIG. 1 can be modified as follows.

The first port of the first control element 5 may be connected directly to the first junction point 17 without passing through the first capacitor 4. In this case, the second capacitor 4 is connected between the first and second ports of the first control element 5.

Similarly, the first port of the second control element 11 may be connected directly to the second junction point 19 without passing through the second capacitor 12. In this case, the second capacitor 12 is connected between the first and second ports of the second control element 11.

In the case of the above modified circuitry, the frequency converter is operated as an upconverter in the following way: the second voltage, which turns off the first-second port operation in the first control element 5 and turns on the first-second port operation of the second control element 11, is applied to the control voltage terminal 20. The converter is operated as a downconverter in the following way: the second voltage, which turns on the first-second port operation of the first control element 5 and turns off the first-second port operation of the second control element 11, is applied to the control voltage terminal 20.

Circuit design principles for the frequency converter shown in FIG. 1 will be explained in more detail.

For designing matching circuits for global use, the first step is to design a conventional matching circuit with transmission lines so as to operate at a higher frequency, and match one port in the mixer circuit with input/output ports. The next step is to configure FET-driven resonance type mixing circuits as shown in FIG. 1. In this case, circuit optimization is carried out using an FET showing infinite impedance. Here, when this FET shows a low impedance, the mixing circuit is optimized for the lowest frequency. After this first step in the optimization process is completed, global optimization for all other mixing structures can be carried out, and optimum values for the capacitance, inductance and the control FET for matching are derived at a desired frequency. A mixing FET is able to vary equivalent capacitances for the gate voltage by activating the voltage control function of a control FET to adjust the frequency of the respective matching circuit.

The frequency converter shown in FIG. 1 has an up-conversion function to convert, for example, input signals at 2 GHz to output 10 GHz signals using local oscillator operating at 8 GHz, and has a down-conversion function to convert, for example, input signals at 10 GHz to output 2 GHz signals using local oscillator operating at 8 GHz.

The input port 1 showing a 50 Ω impedance is connected to the matching circuit 2 comprised of a plurality of transmission lines. The matching circuit 2 must convert the input-port impedance of 50 Ω to an impedance at junction point 17 which depends greatly on the operating states of the central mixing element 7 and control FET 5. The matching circuit 2 may be constructed with one transmission line of a given length having a 50 Ω characteristic impedance. When the control FET 5 is off (in this case, there will be no resonance from the combination of inductance 3 and a capacitor 4 at the junction point 17), matching circuit 2 must match its impedance to the highest frequency, 10 GHz. In this case, any contribution from 2 GHz signals must be blocked. If one transmission line is insufficient, matching circuit 2 may be comprised by two transmission lines and open lines connected therebetween.

Matching circuit 2 is connected to an inductor (self-inductance) 3 to serve as a resonance element to resonate with the control FET 5. A value of a matching inductance L for an inductor 3, normally several pF, to correspond with the source-drain capacitance of the control FET 5 is calculated using the following relation so that it can operate at a frequency of 2 GHz.

$$L \cdot C \cdot 4 \cdot F^2 \cdot \pi^2 = 1$$

The value of the voltage source VG is adjusted so as to satisfy the action point of the mixing element (mixing FET) 7 for the pinch-off voltage.

The junction point 17 of the inductor 3 and the matching circuit 2 is connected, through the capacitor 4, to the drain of the control FET 5.

The capacitor 4 must be taken into consideration in the above relation. When the gate-activation voltage of the control FET 5 is set to 0 volt, the source-drain impedance is considered to be zero, so that resonance frequency can be established according to the above relation. The values for the inductance and capacitance are determined in real time during the matching process, and therefore, matching is carried out for 2 GHz. When the control voltage is set to about 1 volt, the control FET 5 is opened, and neither capacitance nor inductance needs to be considered for the process of circuit matching. Inductance values in this case are several nH, and are too large to affect the operation at 10 GHz.

The junction point 17 is connected to the gate of mixing FET 7, through the fifth matching circuit 6 comprised by transmission lines provided separately for converting the impedance at junction point 17 to input gate-impedance of mixing FET 7, particularly for 10 GHz signals. This value should be chosen appropriately to enable to achieve mixing at a desired operating frequency.

The source terminal of the mixing FET 7 is connected to the matching circuit 10 which is similar in construction to a conventional strip line circuit, and other end of the matching circuit 10 is connected to port 9, which is connected to a local oscillator (not shown). This matching circuit, in fact, converts the source-impedance of mixing FET 7 to the conventional value of 50 Ω of the local oscillator.

Action at the gate of the mixing element 7 can be explained in a similar manner. The matching circuit 18 converts the drain-impedance at the drain terminal to the junction-impedance at junction point 19, particularly for 10 GHz signals. This is because, for 2 GHz operation, matching process is carried out by selecting an inductance and a control FET, in reality. The matching circuit 18 is constituted by transmission lines, but one transmission line is often sufficient.

The inductor 13 is connected to the voltage source VD normally at 2 volts for impressing a bias voltage to the drain terminal of the mixing element 7.

The junction point 19 is connected to the matching circuit 15, constituted by transmission lines, for converting the output impedance of 50 Ω to an indicated impedance, at 10 GHz operation in practice.

The junction point 19 is also connected, through the capacitor 12, to the drain terminal of the control FET 11.

The control voltage of the control FET 11 must be synchronized so that the resonance is activated at the gate, and not at the drain. This means that the gate is matched to 2 GHz signals while output is matched to 10 GHz signals. This represents an up-mixer (upconverter) structure. Conversely, when resonance is activated at the drain and not at the gate, the drain is matched to 2 GHz signals while the gate is matched to 10 GHz signals. This represents a downconverter structure.

Control voltage for gate-control-FET is either 0 or 1 volt so that the inverter circuit which is used in the embodiment is a conventional logic inverter, and it may be provided externally to the frequency conversion circuit.

Figure 2:
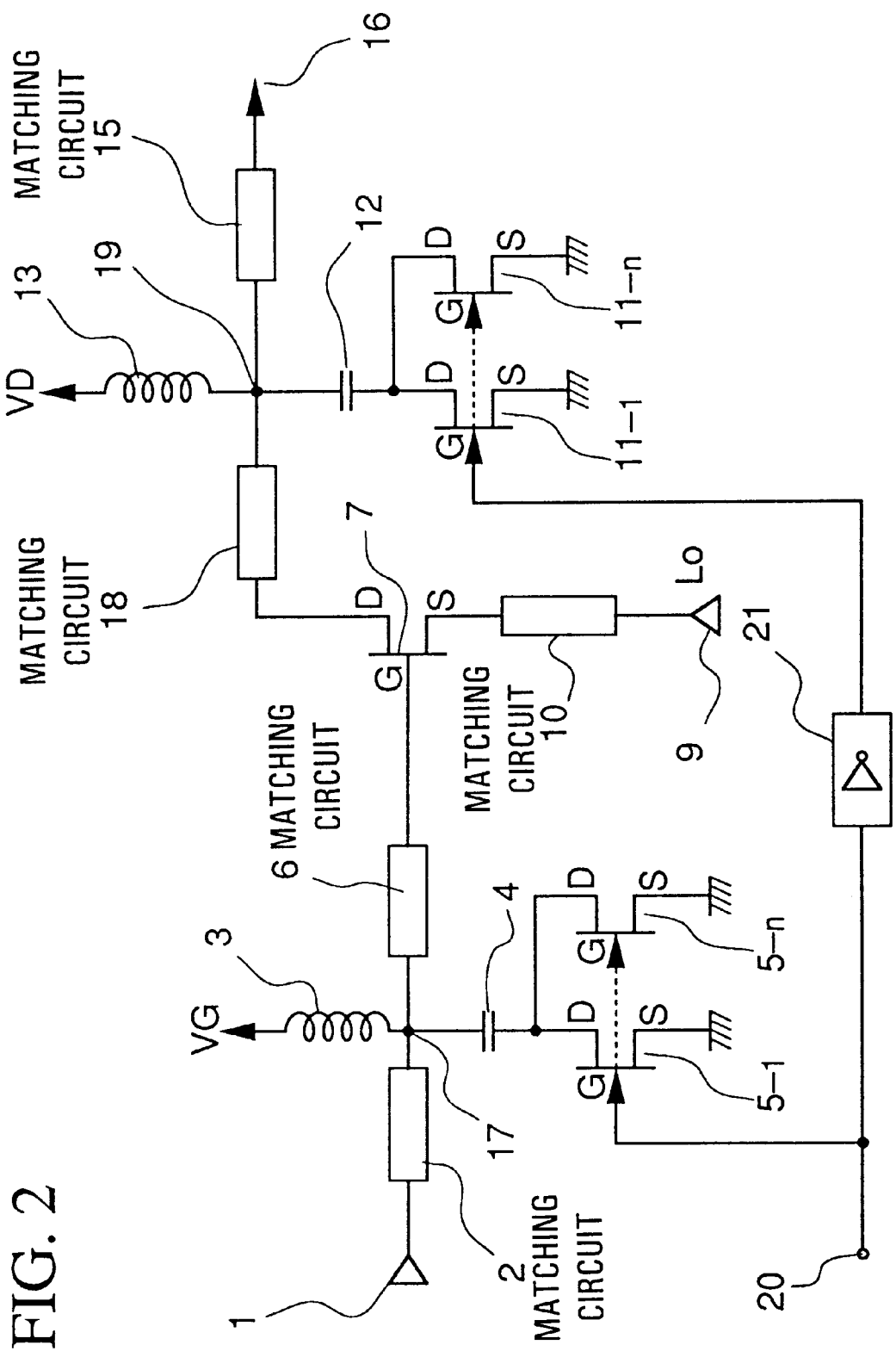
FIG. 2 is a block diagram of a second embodiment of the frequency converter of the present invention.

FIG. 2 shows a second embodiment of the frequency conversion circuit. This circuit is essentially the same as that for the first embodiment, except for the following features.

Specifically, in the second embodiment, the control FET 5 in FIG. 1 is replaced with a plurality of FET 5-1~5-n, each comprised by: a drain connected to other end of the first capacitor 4; a grounded source; and a gate connected to the control voltage terminal 20. Also, the control FET 11 is replaced with a plurality of FET 11-1~11-n, each comprised by: a drain connected to other end of the second capacitor 12; a grounded source; and a gate connected, through an inverter circuit 21, to the control voltage terminal 20.

In this case, when n (an integer larger than 2) pieces of FETs connected in parallel are used to control low frequency resonance, calculation is based on the following relation:

$$L \cdot C' \cdot 4 \cdot F^2 \cdot \pi^2 = 1$$

where C' is a value obtained by multiplying n with the values of source-drain capacitance of each FET.

Single commutation is achieved by synchronizing the triggering of all the gates of the FETs, thereby forming a link circuit.

Figure 3:
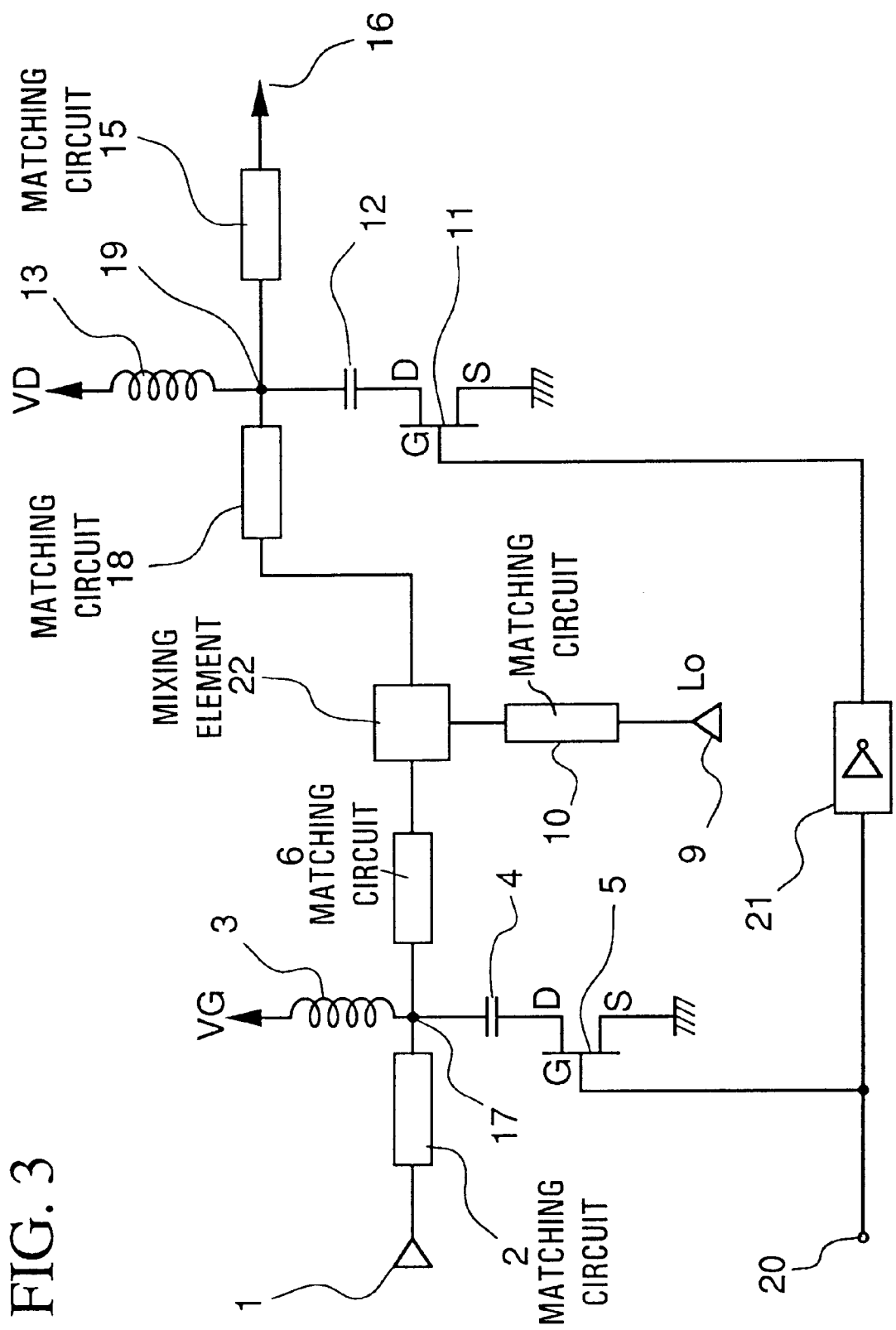
FIG. 3 is a block diagram of a third embodiment of the frequency converter of the present invention.

FIG. 3 shows a third embodiment of the frequency converter. This frequency converter is the same as the one shown in FIG. 1, except for the following feature. In this converter, the mixing FET 7 is replaced with a three-port mixing element 22 comprised by: a first port connected, through the matching circuit 6, to the junction point 17; a second port connected to the matching circuit 10; a third port connected to the matching circuit 18; for mixing the signals at the first and second ports and outputting the mixed signals to the third port. The three-port mixing element 22 may be comprised by a combination of diodes or FETs, for example.

Figure 4:
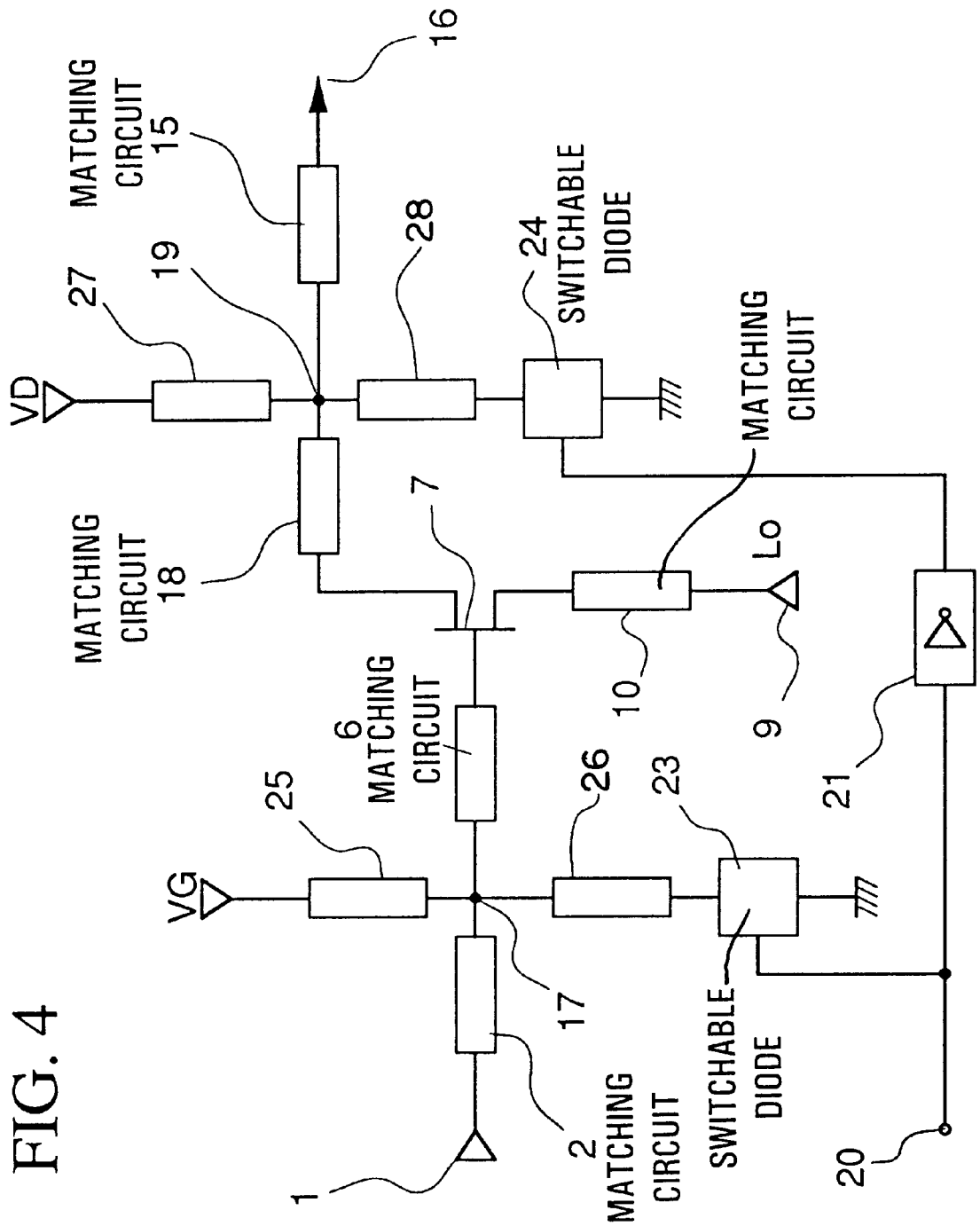
FIG. 4 is a block diagram of a fourth embodiment of the frequency converter of the present invention.
Figure 5:
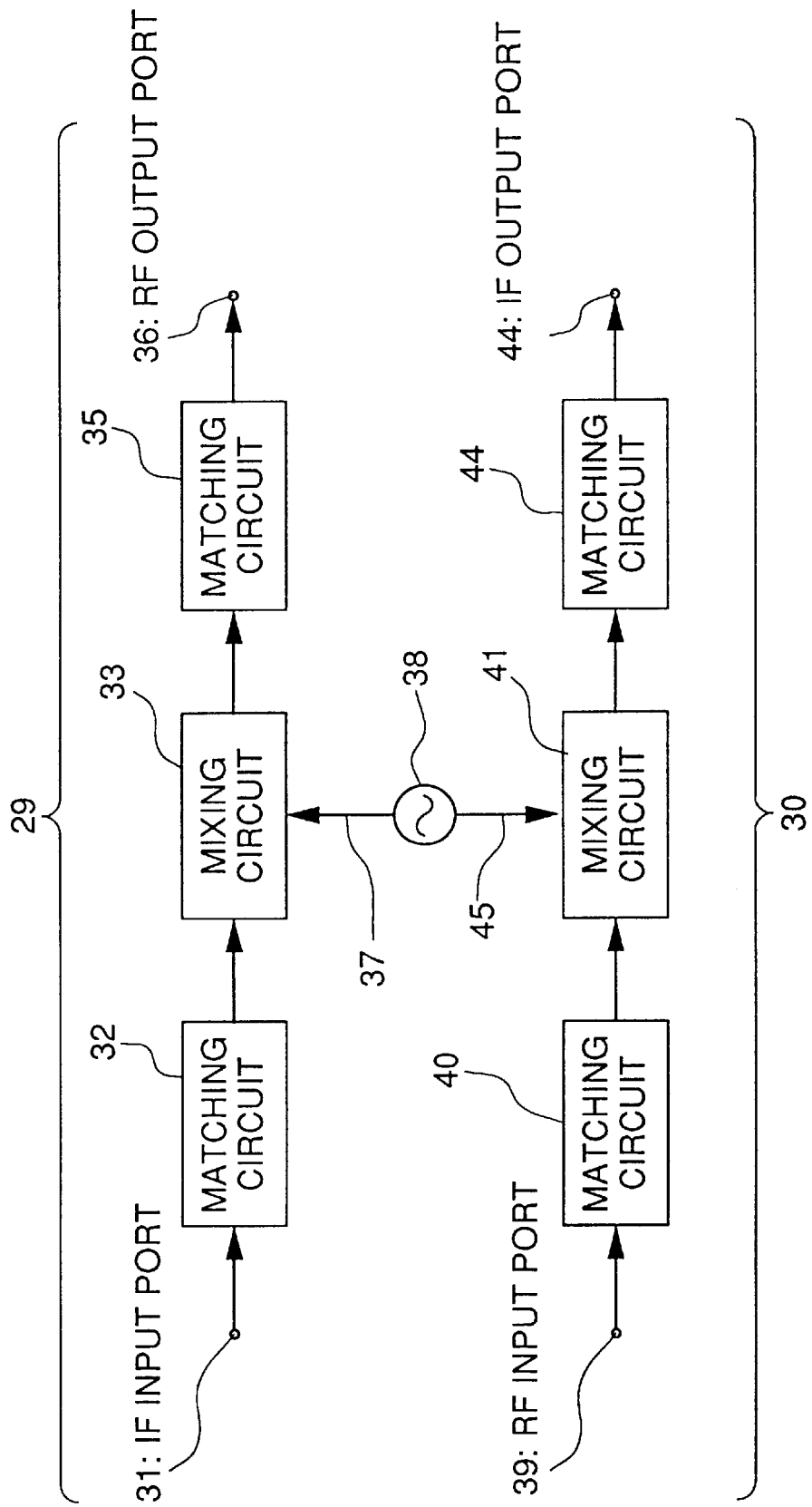
FIG. 5 is a block diagram of a conventional frequency converter.
Figure 6:
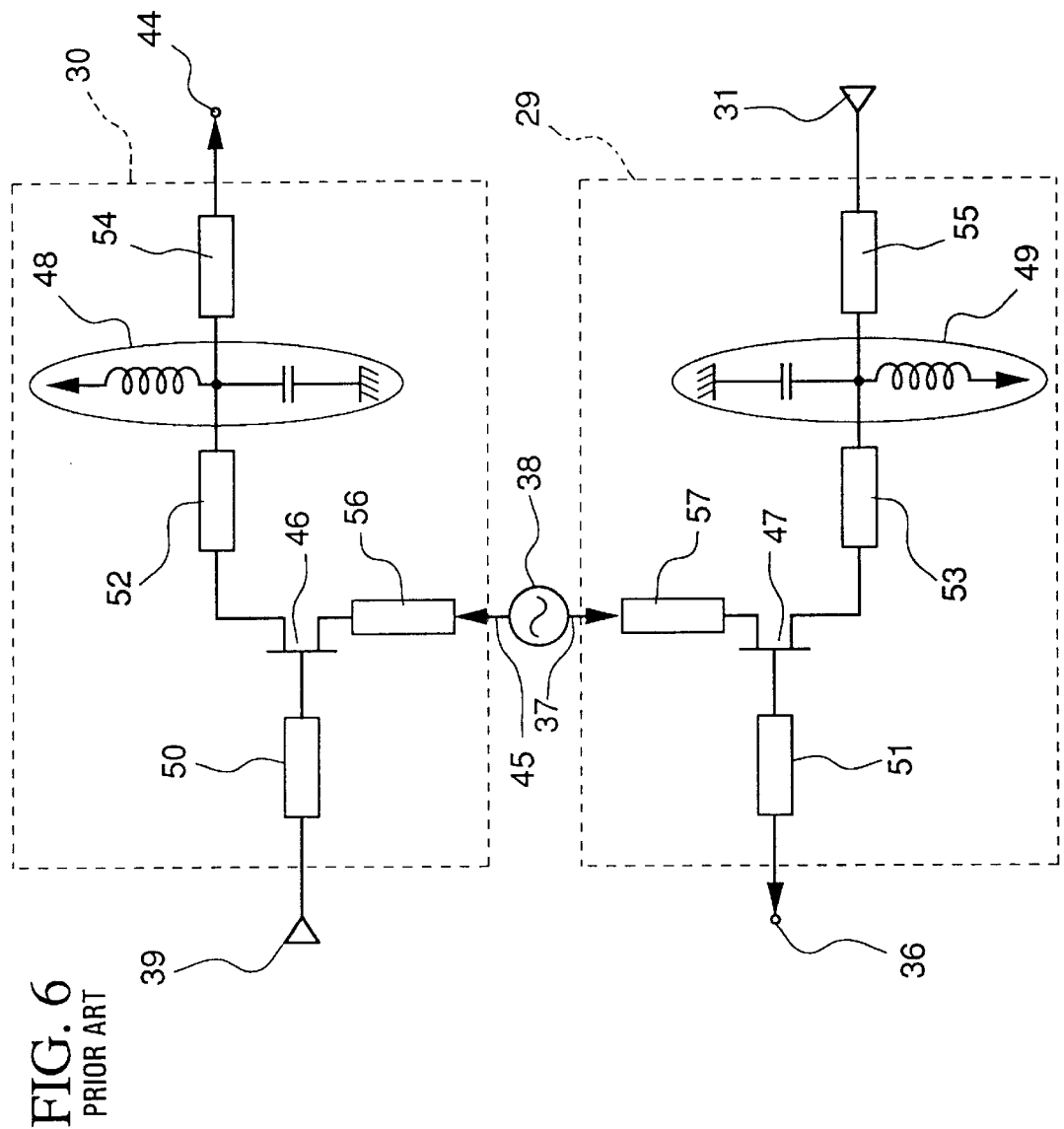
FIG. 6 is a block diagram of another conventional frequency converter.

FIG. 4 shows a fourth embodiment of the frequency converter. This frequency converter is the same as the one shown in FIG. 1, except for the following features. The first inductor 3, first capacitor 4, second inductor 13 and second capacitor 12 are replaced with transmission lines 25, 26, 27 and 28, respectively. Also, first and second FETs 5, 11 are replaced with switchable diodes 23, 24 serving as the first and second control elements, respectively. The principle of adaptable matching is based on resonance type converters, therefore, the FETs 5, 11 which are voltage regulated, can be replaced with any equivalent components so that voltage-controlled diodes may be used, for example. Similarly, if the frequency is sufficiently high, inductance (inductor) may be replaced with transmission lines such as micro-strip lines. Resonance computation can be made in a similar manner to that described earlier by taking into account active structures and equivalent inductance of the transmission lines.

What is claimed is:

1. A frequency converter comprising:

a first matching circuit having one end connected to an input port for receiving input signals;

a first inductor having one inductor end connected to other end of said first matching circuit, and other inductor end to a first voltage source;

a first control element having a first port connected, through a first capacitor, to a first junction of said first inductor and said first matching circuit, a grounded second port, and a third port connected to a control voltage terminal to be activated with a control voltage supplied from either the first voltage source or a second voltage source;

a second matching circuit having one end connected to a local oscillator signal port for inputting local oscillator signals;

a mixing element, having a first port connected to said first junction, a second port connected to other end of said second matching circuit, and a third port, wherein signals at said first port and said second port are mixed and output to said third port;

a third matching circuit having one end connected to said third port of said mixing element;

a second inductor having one inductor end connected to other end of said third matching circuit, and other inductor end to the second voltage source;

a second control element having a first port connected, through a second capacitor, to a second junction point of said second inductor and said third matching circuit, a grounded second port; and a third port connected, through an inverter circuit, to said control voltage terminal; and a fourth matching circuit having one end connected to said second junction point, and other end to an output port.

2. A frequency converter according to claim 1, wherein said frequency converter is operated as an upconverter by applying a first voltage, which turns on a first-second port operation in the first control element and turns off a first-second port operation in the second control element, to the control voltage terminal; while said frequency converter is operated as a downconverter:

by applying said second voltage, which turns off a first-second port operation in the first control element and turns on a first-second port operation in the second control element, to the control voltage terminal.

3. A frequency converter according to claim 1, wherein said first port of said mixing element is connected, through said fourth matching circuit, to said first junction point.

4. A frequency converter according to claim 1, wherein said mixing element is a mixing field-effect-transistor, having a gate, a source and a drain to serve respective functions of said first port, said second port and said third port.

5. A frequency converter according to claim 1, wherein said first control element is a control FET, having a drain, a source and a gate to correspond to said first port, said second port and said third port; and said second control element is a control FET having a drain, a source and a gate to correspond to said first port, said second port and said third port.

6. A frequency converter according to claim 5, wherein said first control element is comprised by a plurality of control FETs, each having a drain with one end connected to other end of the first capacitor, a grounded source, and a gate connected to the control voltage terminal; and said second control element is comprised by a plurality of control FETs, each having a drain with one end connected to other end of the second capacitor, a grounded source, and a gate connected, through an inverter circuit, to the control voltage terminal.

7. A frequency converter according to claim 1, wherein said frequency converter has transmission lines serving respective functions of said first inductor, said first capacitor, said second inductor, and said second capacitor.

8. A frequency converter according to claim 1, wherein a first port of a first control element is directly connected to a first junction point without passing through a first capacitor, and said first capacitor is connected between said first port and said second port of said first control element; and a first port of a second control element is directly connected to a second junction point without passing through a second capacitor, and said second capacitor is connected between said first port and said second port of said second control element.

9. A frequency converter according to claim 8, wherein said frequency converter is operated as an upconverter by applying a second voltage, which turns off a first-second port operation in the first control element and turns on a first-second port operation in the second control element, to said control voltage terminal; while said frequency converter is operated as a downconverter:

by applying a first voltage, which turns on a first-second port operation in the first control element and turns off a first-second port operation in the second control element to said control voltage terminal.

* * * * *